(12) United States Patent
Koster et al.

(10) Patent No.: US 10,739,373 B2
(45) Date of Patent: Aug. 11, 2020

(54) MICROMECHANICAL SPRING FOR A SENSOR ELEMENT

(71) Applicant: Robert Bosch GmbH, Stuttgart (DE)

(72) Inventors: Monika Koster, Reutlingen (DE); Rudy Eid, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 329 days.

(21) Appl. No.: 15/786,994

(22) Filed: Oct. 18, 2017

(65) Prior Publication Data

US 2018/0106829 A1    Apr. 19, 2018

(30) Foreign Application Priority Data

Oct. 19, 2016   (DE) .................. 10 2016 220 507

(51) Int. Cl.
*G01P 15/08*    (2006.01)
*G01P 15/03*    (2006.01)

(52) U.S. Cl.
CPC ........ *G01P 15/0802* (2013.01); *G01P 15/032* (2013.01); *G01P 15/08* (2013.01); *B81B 2203/0154* (2013.01); *G01P 2015/0828* (2013.01); *G01P 2015/0851* (2013.01)

(58) Field of Classification Search
CPC .... G01P 15/0802; G01P 15/08; G01P 15/032; G01P 2015/0828; G01P 2015/0851; B81B 2203/0154; B81B 2201/0228; B81B 3/0027; B81C 1/0019; G01C 19/5712
See application file for complete search history.

(56) References Cited

U.S. PATENT DOCUMENTS

| | | | |
|---|---|---|---|
| 2004/0129077 A1* | 7/2004 | Franz | B81B 3/0051 73/514.14 |
| 2008/0141774 A1 | 6/2008 | Classen et al. | |
| 2013/0192362 A1 | 8/2013 | Rytkonen | |
| 2014/0331770 A1 | 11/2014 | Jourdan et al. | |
| 2014/0338450 A1* | 11/2014 | Classen | B81B 3/0045 73/514.32 |
| 2015/0053002 A1* | 2/2015 | Ullrich | B81B 3/0027 73/514.15 |
| 2016/0033274 A1* | 2/2016 | Reinmuth | G01C 19/5621 73/504.12 |
| 2017/0297897 A1* | 10/2017 | Duerr | G02F 1/0128 |

FOREIGN PATENT DOCUMENTS

DE    102006051329 A1    5/2008

* cited by examiner

*Primary Examiner* — David Z Huang
(74) *Attorney, Agent, or Firm* — Norton Rose Fulbright US LLP; Gerard Messina

(57) ABSTRACT

A micromechanical spring for a sensor element, including at least two spring sections formed along a sensing axis, the at least two spring sections each having a defined length, and the at least two spring sections having different defined widths.

10 Claims, 3 Drawing Sheets

MICROMECHANICAL SPRING FOR A SENSOR ELEMENT

CROSS REFERENCE

The present application claims the benefit under 35 U.S.C. § 119 of German Patent Application No. DE 102016220507.2 filed on Oct. 19, 2016, which is expressly incorporated herein by reference in its entirety.

FIELD

The present invention relates to a micromechanical spring for a sensor element. The present invention also relates to a method for manufacturing a micromechanical spring for a sensor element.

BACKGROUND INFORMATION

Torsion springs are presently designed in z-acceleration sensors and xz-acceleration sensors (as a rotatable rocker) either having a simple beam, a length and a width being used as a degree of design freedom, or as a conductor spring (two longitudinal beams connected by cross beams) if, in addition to the usual requirements (requirements relating to detection sensitivity, etc.) vibration requirements must also be met.

In the case of a simple beam, the required use mode (detection mode) is adjusted by a length and a width, which means that positions of other modes are predefined. Thus, shifting the interference mode without shifting the use mode and vice versa is virtually impossible.

A present approach to this problem is to use very short and very thin micromechanical springs, which inevitably results in a wide production variation (strongly dependent on an edge loss, i.e., deviations of actually produced dimensions as opposed to planned dimensions due to production tolerances).

U.S. Patent Application Publication No. 2008/0141774 A1 describes an acceleration sensor, which is sensitive in one direction, measurements being virtually undistorted due to interference accelerations acting perpendicular to this direction. For this purpose, springs of the acceleration sensor have two bending beams, which are connected by cross beams.

German Patent Application No. DE 10 2006 051 329 A1 describes a z-accelerator sensor based on the rocker principle, which has a reduced interference sensitivity as a result of design-related errant deflections. For this purpose, a multiple arrangement of multiple torsion springs extending in parallel is described, as a result of which a flexural stiffness of the arrangement is increased significantly as compared to the flexural stiffness of one individual spring.

U.S. Patent Application Publication No. 2014/0331770 A1 describes a mechanical connection, which forms a pivotal point for MEMS mechanical structures and NEMS mechanical structures.

U.S. Patent Application Publication No. 2013/0192362 A1 describes a vibration-tolerant acceleration sensor structure.

SUMMARY

An object of the present invention is to provide an improved micromechanical spring for a sensor element.

The object may be achieved with a micromechanical spring for a sensor element in accordance with an example embodiment of the present invention, including:

at least two spring sections formed along a sensing axis; the at least two spring sections each having a defined length; and
the at least two spring sections having different defined widths.

In this way, an added degree of freedom is advantageously provided for the micromechanical spring, in that a sensitivity with respect to interference mode is influenceable.

According to a second aspect, the present invention provides a method for manufacturing a micromechanical spring for a sensor element, including the step:

forming at least two spring sections, the at least two spring sections being formed in such a way that a first spring section having a first length is formed with a defined width differing from that of a second spring section having a second length.

Preferred specific embodiments of the micromechanical spring according to the present invention are described herein.

One advantageous refinement of the micromechanical spring is distinguished by the fact that the at least two spring sections are designed in such a way that in a frequency space a detection mode of the micromechanical spring is a defined distance apart from an interference mode of the micromechanical spring. This advantageously provides a desired insensitivity to the interference mode, which is advantageous for certain sensors. A mode-optimized spring design is implemented in this way, which effectuates favorable operating properties of the sensor element.

Another advantageous refinement of the micromechanical spring is characterized in that the detection mode of the micromechanical spring is influenceable with the first spring section and the interference mode of the micromechanical spring is influenceable with the second spring section. In this way certain modes may each be influenced with the various spring sections, which allows for a broad diversity in the design of the micromechanical spring.

Another advantageous refinement of the micromechanical spring is characterized in that dimensions of the spring are ascertained with the aid of simulation methods. In this way, it is possible to use proven development tools for designing the micromechanical spring, for example, in the form of finite element simulations.

Another advantageous refinement of the micromechanical spring is characterized in that transition areas between the spring sections are formed with a defined rounding. In this way, it is facilitated that a risk of breakage for the micromechanical spring is advantageously minimized.

Another advantageous refinement of the micromechanical spring is characterized in that the micromechanical spring is integrally formed with a rocker element of the sensor element. In this way, it is possible to use proven micromechanical manufacturing processes for manufacturing the micromechanical spring.

The present invention is described in detail below having additional features and advantages with reference to multiple figures. The figures serve to elucidate in principle the present invention and are not necessarily rendered true to scale.

Disclosed method features result analogously from corresponding disclosed product features and vice versa. This means, in particular, that features, technical advantages and embodiments relating to the method for manufacturing a micromechanical spring for a sensor element result analogously from corresponding embodiments, features and advantages relating to the micromechanical spring for a sensor element, and vice versa.

DETAILED DESCRIPTION OF EXAMPLE EMBODIMENTS

An example embodiment of the present invention provides a micromechanical spring for a sensor element, which includes an expanded degree of design freedom with respect to a specific operating characteristic in the form of an interference mode. In this way, it is possible to advantageously influence both the detection mode as well as the interference mode of the micromechanical spring, as a result of which an operating behavior of the sensor element including the micromechanical spring may be designed according to specifications.

Detection mode (use mode) and interference mode are understood below to mean frequencies or frequency ranges in a frequency space, which define frequencies for an intended excitation (detection mode) or an unintended excitation (interference mode) of mechanical spring 100. The two cited modes in this case represent a first mode and a second mode, there actually being an infinite number of modes available which, with increasing number of modes, requires in each case greater mechanical excitation energy. Ultimately, the detection mode or the interference mode defines stiffnesses or degrees of deflections that the sensor experiences under a defined acceleration force (for example, 1 G).

Figure 1:
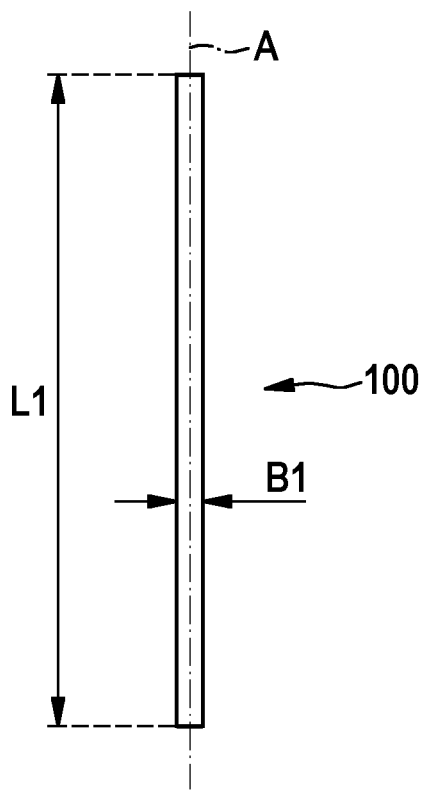
FIG. 1 shows a micromechanical spring according to the related art.

FIG. 1 shows a top view of a conventional micromechanical spring 100 for a sensor element, spring 100 being designed as a torsion spring, which is twistable about a torsion axis A. Spring 100 is noticeably designed with parallel side areas having a length L1 and a width B1, with which a detection mode (use mode) of micromechanical spring 100 is defined. However, an interference mode of micromechanical spring 100, which cannot be changed, is disadvantageously also defined with length L1 and width B1.

Not depicted in FIG. 1 is a rocker structure for a z-sensor element formed on both sides of micromechanical spring 100, which normally has an asymmetrical design in order to effectuate in this way an out-of-plane deflection of the rocker structure and to detect an acceleration force.

This conventional spring 100 may be operated according to an interference mode due to the fact that the spring is also twisted within the xy-plane, which negatively affects an operating behavior and sensing behavior of the sensor element (for example, by generating false signals).

If the cited interference modes coincide with frequencies, at which voltage pulses and, thus, force pulses are generated by an evaluation circuit (not depicted), (in particular, at whole number multiples of the operating frequency of the sensor), these interference modes may then be excited by the evaluation circuit. This may disadvantageously result in false sensor signals.

Figure 2:
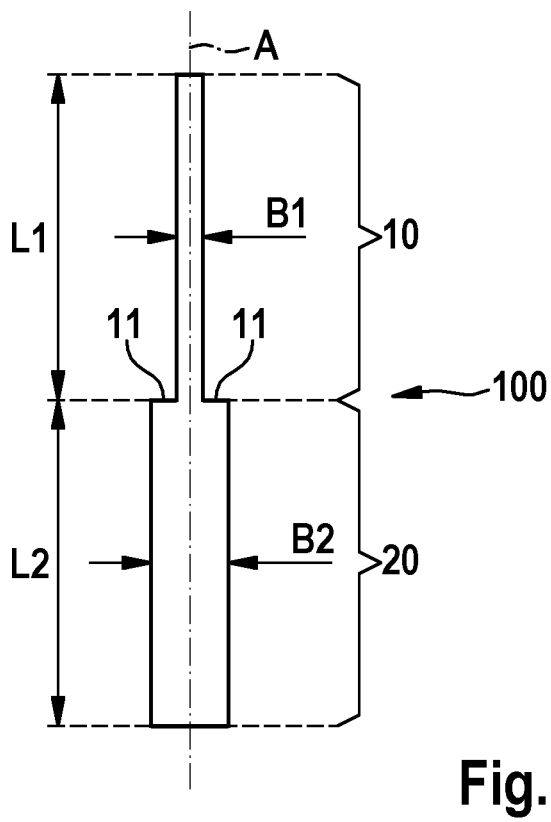
FIG. 2 shows a first specific embodiment of a described micromechanical spring for a sensor element.

FIG. 2 schematically shows a top view of a first specific embodiment of a described micromechanical spring 100. It is apparent that micromechanical spring 100 includes two spring sections 10, 20, first spring section 10 including a length L1 and a width B1 and a second spring section 20 including a length L2 and a width B2.

In this way, the detection mode may be advantageously influenced by first spring section 10 and the interference mode may be advantageously influenced by second spring section 20. Thus, a degree of freedom with respect to the interference mode is advantageously provided, so that micromechanical spring 100 designed in this way may be optimally adapted to a predefined specification. In this way, a defined torsional stiffness of described micromechanical spring 100 may be advantageously implemented.

Transitional areas 11 between first spring section 10 and second spring section 20 each include a section having a defined radius of curvature or a curved delimited recess. As a result, mechanical notch stresses, for example, may be reduced and, as a result, a risk of breakage for described micromechanical spring 100 may be advantageously greatly reduced.

All geometric dimensions of micromechanical spring 100 are sized preferably with the aid of known simulation methods, for example, with the aid of finite element simulation methods.

One exemplary described micromechanical spring 100 has a total length of (L1+L2) of approximately 100 μm, an average width of approximately 2 μm and a depth of approximately 20 μm. It is self-evident, however, that arbitrary other geometric dimensions for micromechanical spring 100 are possible.

The interference mode in such case is preferably designed in the frequency space in such a way that it is situated in the frequency space a defined distance apart from the detection mode. In this way, it is possible to implement a defined decoupling of the detector mode and the interference mode for the sensor element.

Figure 3:
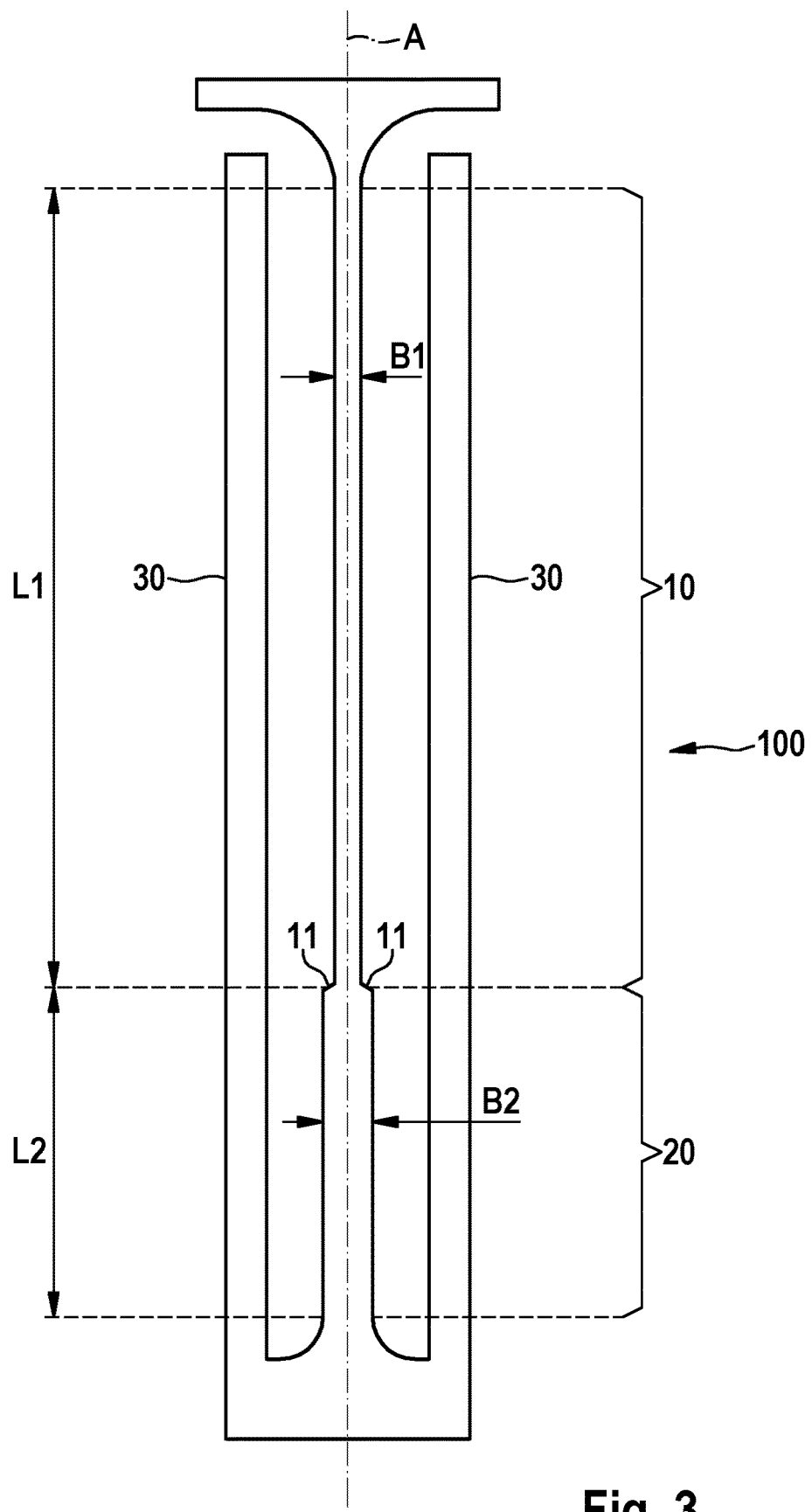
FIG. 3 shows a top view of another specific embodiment of a described micromechanical spring for a sensor element.

FIG. 3 shows a top view of another specific embodiment of micromechanical spring 100. The two spring segments 10, 20 of different widths along the sensing axis or torsion axis A are readily apparent, micromechanical spring 100 being integrally formed with rocker 30.

In this way, it is advantageously possible to manufacture spring 100, together with rocker 30, formed as one piece or integrally with the rocker, using common conventional micromechanical methods, for example, gas phase etching. In this way an efficient manufacture of entire rocker 30 with spring 100 is facilitated.

Rounded transition areas 11 between first spring section 10 and second spring section 20 are also readily apparent in FIG. 3.

The spring may be advantageously used for applications in the automotive sector (for example, for sensors for ESP control units) or in mobile terminals, different sensor sensitivities being provided for each of the cited purposes, which ultimately require differently designed micromechanical springs.

Not depicted in the figures are additional advantageous specific embodiments of described micromechanical spring 100, which have more than two spring sections. It is conceivable, for example, that micromechanical spring 100 has three or even more spring sections, each having different widths, spring sections having equal widths also being able to be provided, if necessary.

In one advantageous refinement of micromechanical spring 100, the micromechanical spring is combined with a second spring 110 to form a micromechanical spring system 300. This is indicated, in principle, in FIG. 4, which depicts a cross sectional view of such a spring system 300 having two micromechanical springs 100, 110 situated one upon the other. The two micromechanical springs 100, 110 are connected, i.e., mechanically coupled, to one another in the sensor element with the aid of at least two connecting elements 120, preferably at border areas. In this way, a sensor element having spring system 300 may be provided with improved symmetry, because an essentially center of gravity is implemented in the layer system of micromechanical spring system 300. In this way, cross effects acting on the sensor element may be better compensated for.

Figure 4:
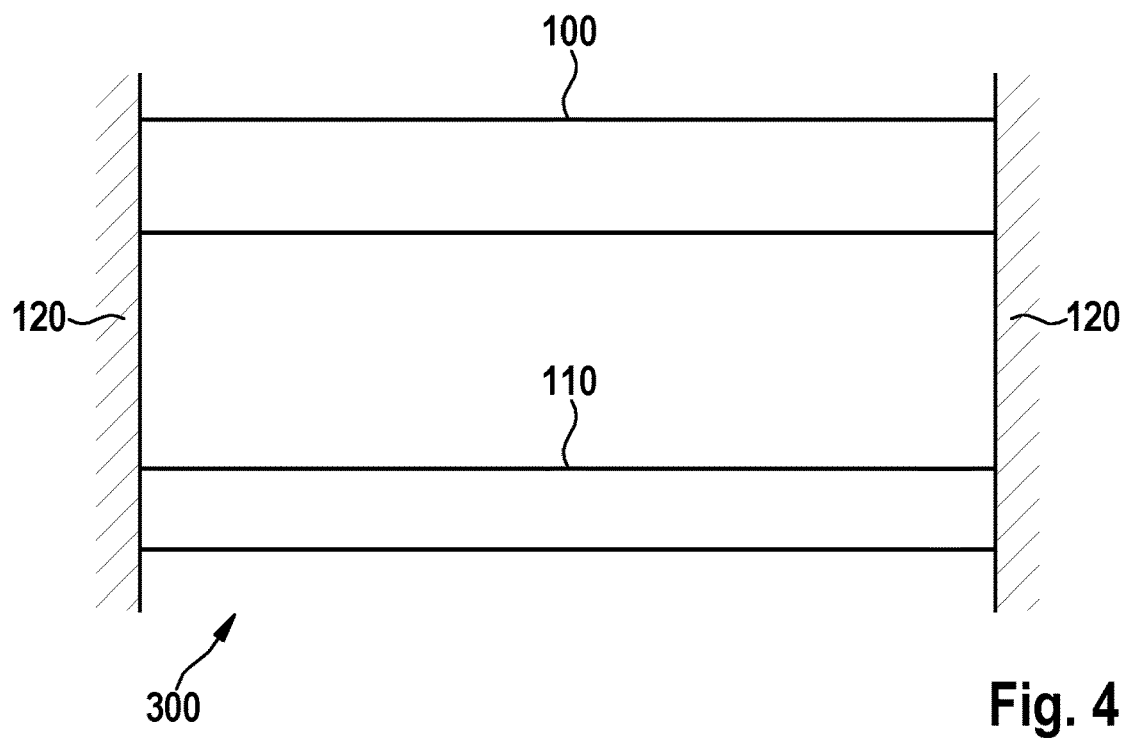
FIG. 4 shows a cross sectional view of an embodiment of a spring system having two micromechanical springs one on top of the other.
Figure 5:
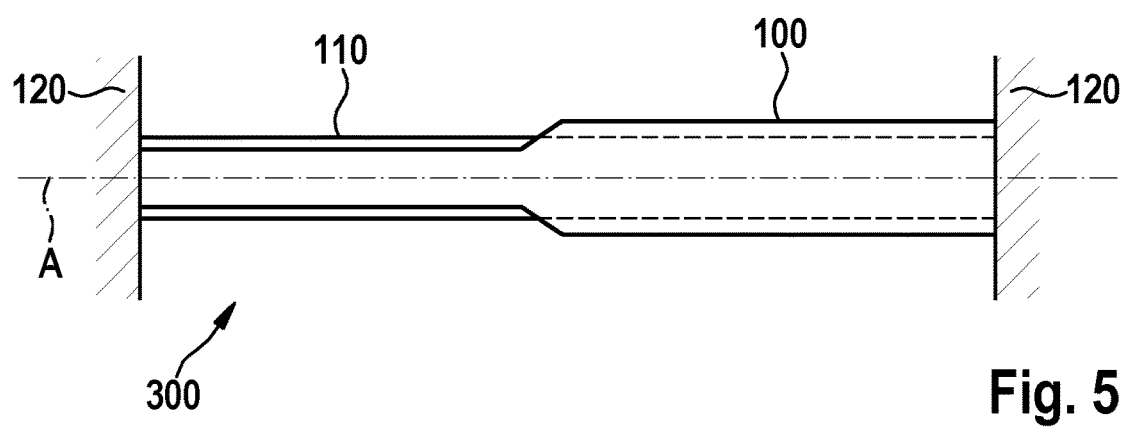
FIG. 5 shows a top view of the arrangement shown in FIG. 4.

FIG. 5 shows the arrangement of FIG. 4 in a top view. It is apparent that upper lying micromechanical spring 100 has a stepped design according to the principles explained above. Underlying micromechanical spring 110 has a straight design, but it is also possible for the upperlying micromechanical spring to have a straight design and for the underlying micromechanical spring to have a stepped design.

Additional variants of the micromechanical spring system not depicted in the figures include three and even more micromechanical springs situated one upon the other, which are suitably coupled to one another.

Figure 6:
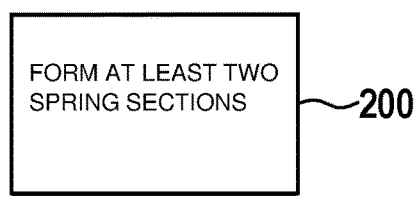
FIG. 6 shows a schematic flow chart of a method for manufacturing a micromechanical spring for a sensor element.

FIG. 6 shows a schematically depicted sequence of a method for manufacturing a micromechanical spring for a sensor element.

In a step 200, a forming of at least two spring sections 10, 20 is carried out, the at least two spring sections 10, 20 being formed in such a way that a first spring section 100 having a first length L1 is formed with a defined width differing from that of a second spring section 20 having a second length L2.

In summary, the present invention describes an advantageous design for a micromechanical spring for a micromechanical inertial sensor element having an out-of-plane detection, in which design possibilities are provided both for a detection mode as well as for an interference mode.

The present invention, although it was described with reference to preferred specific embodiments, is in no way limited thereto.

Those skilled in the art will therefore accordingly modify and combine the features with one another, without departing from the core of the present invention.

What is claimed is:

1. A micromechanical spring for a sensor element, comprising:
    at least two spring sections formed along a sensing axis, the at least two spring sections each having a respective defined length, the at least two spring sections having different defined widths relative to one another, wherein each of the at least two spring sections is a spring;
    wherein the micromechanical spring formed of the at least two spring sections is integrally formed in one piece with a rocker element of the sensor element, the rocker element extending in parallel to the micromechanical spring and the sensing axis, and the rocker element extending along a length of the micromechanical spring on two different sides of the micromechanical spring;
    wherein the at least two spring sections includes a first spring section and a second spring section, each of the first spring section and the second spring section having a respective first end of its respective defined length and a respective second end of its respective defined length opposite from the respective first end, the respective first end of the first spring section being integrally formed with the rocker element, the respective second end of the first spring section being integrally formed with and directly connected to the respective first end of the second spring section, the second end of the second spring section is not directly connected to the rocker element, and wherein the first spring section extends along the sensing axis for its respective defined length in a first plane, and the second spring section extends along the sensing axis for its respective defined length in the first plane so that the first spring section and the second spring section are co-planar.

2. The micromechanical spring as recited in claim 1, wherein the at least two spring sections are formed in such a way that in a frequency space, a detection mode of the micromechanical spring is a defined distance apart from an interference mode of the micromechanical spring.

3. The micromechanical spring as recited in claim 2, wherein the detection mode of the micromechanical spring is influenceable by the first spring section and the interference mode of the micromechanical spring is influenceable by the second spring section.

4. The micromechanical spring as recited in claim 1, wherein dimensions of the spring are ascertained with the aid of simulation methods.

5. The micromechanical spring as recited in claim 1, wherein transition areas between the spring sections are designed with a defined rounding.

6. The micromechanical spring as recited in claim 1, wherein the micromechanical spring includes a transition area between the first spring section and the second spring section having a defined rounding.

7. A method for manufacturing a micromechanical spring for a sensor element, comprising:
    forming the micromechanical spring from at least two spring sections, the at least two spring sections being formed in such a way that a first spring section having a first length is formed with a defined width differing from that of a second spring section having a second length, the at least two spring sections extending along a first axis, wherein each of the at least two spring sections is a spring;
    wherein the forming of the micromechanical spring from the at least two spring sections includes forming the micromechanical spring integrally in one piece with a rocker element of the sensor element, the rocker element extending in parallel to the micromechanical spring and the first axis, and the rocker element extending along a length of the micromechanical spring on two different sides of the micromechanical spring;
    wherein the at least two spring sections includes a first spring section and a second spring section, each of the first spring section and the second spring section having a respective first end of its respective defined length and a respective second end of its respective defined length opposite from the respective first end, the respective first end of the first spring section being integrally formed with the rocker element, the respective second end of the first spring section being integrally formed with and directly connected to the respective first end of the second spring section, the second end of the second spring section is not directly connected to the rocker element, and wherein the first spring section extends along the sensing axis for its respective defined length in a first plane, and the second spring section extends along the sensing axis for its respective defined length in the first plane so that the first spring section and the second spring section are co-planar.

8. The method as recited in claim 7, wherein the first spring section is formed in such a way that a specification relating to a detection mode of the micromechanical spring is met and the second spring section being formed in such a way that a specification relating to an interference mode of the micromechanical spring is met.

9. The method as recited in claim 7, wherein the micromechanical spring is formed integrally in one piece with the rocker element using gas phase etching.

10. The method as recited in claim 7, wherein the micromechanical spring includes a transition area between the first spring section and the second spring section having a defined rounding.

\* \* \* \* \*